United States Patent
Cole et al.

(10) Patent No.: US 7,232,637 B2
(45) Date of Patent: Jun. 19, 2007

(54) LIGHT SENSITIVE MEDIA FOR OPTICAL DEVICES USING ORGANIC MESOPHASIC MATERIALS

(75) Inventors: Michael C. Cole, Longmont, CO (US); Timothy J. Trentler, Longmont, CO (US)

(73) Assignee: Inphase Technologies, Inc., Longmont, CO (US)

( * ) Notice: Subject to any disclaimer, the term of this patent is extended or adjusted under 35 U.S.C. 154(b) by 7 days.

(21) Appl. No.: 10/931,257

(22) Filed: Sep. 1, 2004

(65) Prior Publication Data

US 2005/0089795 A1   Apr. 28, 2005

Related U.S. Application Data

(60) Provisional application No. 60/499,889, filed on Sep. 4, 2003.

(51) Int. Cl.
*G03F 7/004* (2006.01)
(52) U.S. Cl. ............ 430/269; 430/20; 430/270.1; 430/281.1; 430/288.1
(58) Field of Classification Search .......... 430/269, 430/270.1, 20, 281.1, 288.1, 321
See application file for complete search history.

(56) References Cited

U.S. PATENT DOCUMENTS

| | | | | |
|---|---|---|---|---|
| 6,039,913 A | * | 3/2000 | Hirt et al. | 264/331.11 |
| 6,077,629 A | | 6/2000 | Parker et al. | |
| 6,090,200 A | * | 7/2000 | Gray et al. | 117/68 |
| 6,103,454 A | | 8/2000 | Dhar | |

OTHER PUBLICATIONS

D.L. Gin et al. (2001) "Polymerized Lyotropic Liquid Crystal Assemblies for Materials Applications," Acc. Chem. Res. 34, pp. 974-980.
I.W. Hamley et al. (2002) "A Small-Angle X-ray Scattering Study of the Structure of Gels Formed by Poly(oxyethylene)-Poly(oxypropylene) Diblock Copolymers in Water," Langmuir 18, pp. 1051-1055.
E. Tsuchida et al. (1992) "Polymerization of Unsaturated Phospholipids as Large Unilamellar Liposomes at Low Temperture," Macromolecules 25, pp. 207-212.
M. Jung et al. (2001) "Polymerisation in Lyotropic Liquid-Crystalline Phases of Dioctadecyldimethylammonium Bromide," Colloid Polym. Sci. 279, pp. 105-113.
S. Liu et al. (1999) "Cross-Linking Polymerization in Two-Dimensional Assemblies: Effect of the Reactive Group Site," Macromolecules 32, pp. 5519-5524.
W. Srisiri et al. (1998) "Stabilization of a Biocontinuous Cubic Phase from Polymerizable Monoacylglycerol and Diacylglycerol," Langmuir, 14, pp. 1921-1926.
T.M. Sisson et al. (1996) "Cross-Linking Polymerizations in Two-Dimensional Assemblies," Macromolecules, 29, pp. 8321-8329.
C.L. Lester et al. (2001) "Acceleration of Polyacrylamids Photopolymerization using Lyotropic Liquid Crystals," Macromolecules, 34(25), pp. 8587-8589.

* cited by examiner

*Primary Examiner*—John S. Chu
(74) *Attorney, Agent, or Firm*—Morrison & Foerster LLP

(57) ABSTRACT

Disclosed are mesophasic optical articles, methods of making mesophasic articles and methods of using mesophasic articles. In particular, this invention relates to mesophasic optical articles that can be prepared in situ with out the need of calcination, sintering, solvent evaporation, or other common method.

39 Claims, No Drawings

LIGHT SENSITIVE MEDIA FOR OPTICAL DEVICES USING ORGANIC MESOPHASIC MATERIALS

FIELD OF THE INVENTION

The invention relates to mesophasic optical articles. In particular, this invention relates to mesophasic optical articles that can be prepared in situ.

BACKGROUND

Some current optical devices for holographic data storage, diffractive optical elements (DOEs), holographic optical elements (HOEs), gradient refractive index (GRIN) materials, optical circuits, and optical waveguides use an organic polymer matrix in conjunction with a photopolymerizable material to record light intensity dependent gratings. The inherent advantages of such systems are ease of fabrication, high dynamic range, high sensitivity, good archival life of recorded gratings, and good shelf life. The easiest way to increase the dynamic range of these particular systems is to increase the amount of photopolymerizable material. However, as the photopolymerizable material polymerizes during recording, the photopolymerizable material can shrink, which distorts the optical devices and the holographic recordings thereon. Distortion of the gratings hinders readout of recorded data and changes the wavelength of reflection for display holograms.

Additionally, the sensitivity of grating formation is dependent on the concentration of the photopolymerizable material (monomers and photoinitiators); the sensitivity increases with increases in concentration of photopolymerizable material. Yet again though, shrinkage prevents arbitrarily increasing the concentration of photopolymerizable material. One way to circumvent this concentration limitation is to use a preformed rigid matrix support; for example, a matrix can be made from aerogel, xerogel or from Vycor (a porous silicate glass made by Coming Incorporated). These preformed rigid supports contain channels in which the photopolymerizable material can be inserted. For example, U.S. Pat. No. 6,077,629 to Parker et al. discusses the use of an aerogel material (usually comprised of silica) to form a rigid glass matrix. A photopolymerizable material is infused into the aerogel matrix and then sealed as a single unit. Parker et al. indicate that such a device eliminates problems associated with polymerization induced shrinkage and thus allows for increased dynamic range and sensitivity.

However, one of several disadvantages of using an aerogel, xerogel or Vycor as a supporting matrix is that the matrix is made independently of the device and then the photosensitive material is infused into aerogel or xerogel matrix (as mentioned above). Another disadvantage is that the loading of the photosensitive material into the porous glass structure is difficult (resistance to flow can be high depending on the photosensitive material) and sometimes air can be entrapped in the matrix during loading.

Yet another disadvantage is that without added crosslinker or other mechanism, a recorded spatial light intensity pattern can decrease with time. This is because the formed photopolymer can slowly diffuse through the channels (when the channels are large). In the very least, the use of a porous inorganic glass material involves the additional manufacturing step of infusing the photosensitive material into the porous inorganic matrix as compared to organic matrix systems wherein the organic matrix is formed in situ as discussed in U.S. Pat. No. 6,103,454 to Dhar et al. (The latter organic matrix was not mesophasic).

Aerogels, xerogels, and vycor like materials are all made with a templating agent. The templating agent helps to form the desired mesophase. Typical sol-gel reactions occur during and after mesophase formation, creating at least one inorganic phase. The templating agent is then removed. The article is then typically heated to drive off all templating agents, solvents, and condensates. As mentionsed above, it is at this stage that the material is then infused with photosensitive components forming an organic-inorganic hybrid mesophasic material.

Independent of holographic data storage technology, the field of organic mesophasic materials has enjoyed much attention in the past two decades. Previously, aspects of this field of research were used to develop liquid crystal displays and a variety of novel composite materials. However, more recent interest has been in the development of materials with special morphologies such as hexagonal, lamellar, and interpenetrating cubic phases. Where as the former phases are more widely known and fairly well characterized, the cubic phase is less known and less characterized. See D. L. Gin, et al., Acc. Chem. Res., 34, 974–980, 2001. The unique material properties afforded by the interpenetrating cubic phase has similar characteristics to that of sol-gels and porous inorganics in that two distinct phases are present. Additionally, depending on the molecular size of the constituents that form the cubic phase, the resultant material can be clear and free of light scatter. See I. W. Hameley, et al. Langmuir, 18, 1051–1055, 2002.

Uses for these organically derived mesophasic systems have been limited compared to their inorganic counterparts by the transient nature of the phases themselves. For instance, the phases of the organically derived mesophasic systems typically exist only in small temperature ranges and with specific concentrations of the constituents. Recent work has been done to lock down the structure of the organic mesophasic systems by free radical polymerization of functional groups located on the constituent molecules, for example, see D. L. Gin, et al., Acc. Chem. Res., 34, 974–980, 2001; E. Tsuchida, et al., Macromolecules, 25, 207–212, 1992; M. Jung, A. L. German, H. R. Fischer, Colloid Polym Sci 279, 105–113,2001; S. Liu and D. F. O'Brien, Macromolecules, 32, 5519–5524, 1999; W. Srisiri, et al., Langmuir, 14, 1921–1926, 1998; and T. M. Sisson, et. al., Macromolecules, 29, 8321–8329, 1996. Using free radical polymerization of functional groups did extend the thermal range and stability of the locked in phase when the polymerization was performed quickly, as is typically the situation in photopolymerization. Other methods of locking the phase have been to polymerize a polymer into the channels of the mesophasic systems to lend structural support to the channel system. See C. L. Lester, et. al., Macromolecules, 34:25, 8587–8589, 2001. This method has shown some promising results for stabilizing the phase and some interesting polymerization kinetic data was also revealed. For instance, polymerization rates are enhanced in some mesophasic materials. See C. L. Lester, et. al., Macromolecules, 34:25, 8587–8589, 2001).

The organic mesophasic materials represent an advantage over previous inorganic mesophasic materials in that the templating agents can often be left in the material or that the material itself naturally forms mesophases. However, previous organic-inorganic sol-gel materials were structurally more stable. A combination of the mechanical stability of the sol-gel materials and the ease of formation of the organic mesophasic materials is desirable.

SUMMARY OF THE INVENTION

The present invention makes use of mesophasic morphologies to produce light sensitive optical articles, for example DOEs, HOEs, GRINs, light guides, data storage media, display holograms, from organic, inorganic, and organic-inorganic mesophasic materials. The optical articles preferably have higher sensitivity, higher dynamic range, and/or reduced/eliminated polymerization induced shifting of recorded gratings (from shrinkage during photopolymerization) than current holographic media technologies. The present invention represents an improvement over previous photosensitive sol-gel materials by eliminating the need to remove the templating agent; and opens the field of photosensitive organic mesophasic materials for use in data storage and other optical devices.

In one embodiment the photosensitive article includes a mesophasic material and photosensitive components. The mesophasic material is formed in the presence of the photosensitive components.

Preferably, the photosensitive article includes one or more additives. Preferably, the mesophasic material comprises a bicontinuous cubic phase including a rigid polymeric material with a Tg greater than 50° C. and a soft polymeric material with a Tg less than 30° C. The rigid and soft polymeric materials may be organic, inorganic or an inorganic-organic hybrid. Preferably, one of the continuous phases is substantially devoid of the photosensitive components.

Preferably, the rigid polymeric material is crosslinked. Preferably, one of the continuous phases does not include polymeric material. Preferably, at least one of the continuous phases includes matrix attached polymerizable groups capable of copolymerizing with monomer.

Preferably, the photosensitive components include a photoinitiator, a monomer, a photochromic, a photorefractive component, or a photodimerizable component. Preferably, the photosensitive components include one or more components that are sensitive to at least two different wavelengths.

Preferably, the photosensitive article is a data storage device, display holography device, HOE, DOE, GRIN, optical circuit, or waveguide. Preferably, the mesophasic material includes at least one continuous phase and at least one discontinuous phase. Preferably, one of the continuous phases includes photosensitive components. Preferably, at least one of the photosensitive components is reversible. Preferably, the discontinuous phase includes nanoparticles that are inorganic, organic, or an organic-inorganic hybrid. A preferred nanoparticle comprises silica.

Another embodiment is a method of making a photosensitive article. The method includes mixing photosensitive components with at least another component and forming a mesophasic material having at least two phases.

Preferably, the mesophasic material comprises only organic polymers or only inorganic polymers. Preferably, the mesophasic material is deposited between two substrates to form the photosensitive article or is deposited onto a substrate to form the photosensitive article.

Preferably, the mesophasic material forms a solid monolithic block. Preferably, the article includes an edge seal, an antireflective coating, a servo pattern, a labeling or a cartridge. Preferably, at least one of the phases forms a crosslinked polymer that locks the mesophase morphology. Preferably, the crosslinked polymer is formed by application of light, heat, particle radiation, electric current or sonication. Preferably, the crosslinked polymer is formed by application of a light of a different wavelength than that used to record spatial light intensity patterns. Alternatively, preferably the crosslinking is formed by a step polymerization mechanism. Preferably, the crosslinking occurs during recording of spatial light intensity patterns.

Yet another embodiment is a method of making a mesophasic photosensitive article. The method includes mixing photosensitive components with at least one other component to form a mesophasic photosensitive media without any extractions, infusions, and/or evaporations of components.

Another embodiment is a method of making a photosensitive article. The method includes mixing photosensitive components with at least one other component to form a mesophasic article without mechanical processing, chemical processing, or photochemical processing, to form the mesophasic article.

A further embodiment is a rewriteable photosensitive article. The articles includes a mesophasic material having photosensitive components.

DETAILED DESCRIPTION OF THE INVENTION

The following includes definitions of selected terms used throughout the disclosure. The definitions include examples of various embodiments and/or forms of components that fall within the scope of a term and that may be used for implementation. Of course, the examples are not intended to be limiting and other embodiments may be implemented. Both singular and plural forms of all terms fall within each meaning: Definitions:

Monomer—refers to molecules capable of polymerization via free radical, cationic, and/or anionic mechanisms. In general, the term may refer to a mixture of different monomers. The monomers may be monofunctional, difunctional, or polyfunctional (in regards to the functionality capable of polymerization). Vinyl monomers and epoxides are two example classes of polymerizable molecules. Polymerizable oligomers are considered to be large monomers. Polymerizable dendrimers are also considered as monomers.

Matrix—refers to the polymeric material (organic and/or inorganic) that is used to give desired physical properties to a given media prior to recording of spatial light intensity patterns. Thermoplastic and thermoset materials are considered. For mesophasic materials, each phase can be a completely separate chemical composition. The term "matrix" refers to all polymeric material and other constituents in a media formulation regardless of type and number of different phases present that contribute to the formation of the mesophasic material. For instance, in a two phase system, one phase of the media may be a thermoset while the other phase may be a thermoplastic or even a liquid, together both are referred to as the matrix. Thermoset matrix formation may occur before, after, or during mesophase formation. Formation of a thermoset matrix can occur through any mechanism known to form such materials (chain, step growth, or other mechanisms). The matrix may contain polymerizable functionalities (compatible with polymerization with monomer) and/or attachment sites and/or deattachment sites for photoreactions.

Photoinitiator—For the purpose of the present invention, the term "photoinitiator" refers to the conventional meaning of the term photoinitiator and also refers to sensitizers and dyes. In general, a photoinitiator causes the polymerization of a material, such as a monomer, when the material containing the photoinitiator is exposed to light of a wavelength that activates the photoinitiator. The photoinitiator may refer to a combination of components, some of which individually are not light sensitive, yet in combination are capable of curing the polymerizable monomer; examples are dye/amine, sensitizer/iodonium salt, dye/borate salt, etc.

Inert diffusing agent—Compounds of refractive index different than the monomer or photopolymer, either higher or lower, that are inert to any polymerization, photoreaction, or other chemical reactions that may take place inside the media during recording of gratings, yet typically diffuse away from where polymerization occurs. It is also possible for the inert diffusing agent to diffuse away from areas where photocycloaddition reactions, photochromic reactions, or photorefractive reactions have occurred. In effect, such compounds are excluded from areas where photopolymerization or photoreaction occurred, thus providing the ability to increase the refractive index contrast between the formed photopolymer and the bulk material of the matrix.

Photopolymer—polymer formed from a photoreaction, typically a chain reaction mechanism. Typically, photopolymer formation is caused by photoinitiators or photocatalyst being exposed to irradiation to which they are sensitive.

Photosensitive material—Any material containing components that are light sensitive; where upon irradiation with light, record the spatial light intensity as a chemical change in the media. The chemical change is typically a refractive index change, but can be a photochromic change.

Photosensitive component—refers to the chemicals or combination of chemicals responsible for recording spatial light intensity. As such, some example photosensitive components are photoinitiators, photoinitiators in combination with polymerizable monomers, photorefractives, photochromics and photodimerizable molecules. Some photosensitive components may be capable of reversible reactions, thus allowing for erasing of a recorded spatial light intensity pattern.

Mesophasic material—Materials with more than one phase present, wherein the phase dimensions are on the order of nanometers to hundreds of nanometers. For data storage applications, the phase size and type are preferably of a phase size and type that does not cause significant scatter of light ("significant scatter" is any scatter detectable by the human eye using intensities greater than 100 mW/cm2). Preferably, all chemicals and materials that form the desired mesophase are present in the media formulation and do not require removal of templating agents or infusion into a preformed mesophasic material.

Media—in the context of the present invention, the term "media" refers to the total formulation of chemicals and would exclude substrates, packaging, labeling, etc. . . .

Article—An article of the present invention, is the media and any substrates, edge seals, antireflective coatings, servo patterns, cartridges, etc . . . used to make a fully functional light sensitive optical material.

Plasticizer—refers to any chemical or combinations of chemicals that lower the Tg of a polymer. Plasticizers also tend to increase diffusion rates in polymeric materials. Incidentally, monomers, photoinitiators, inert diffusing agents, and various other additives will often behave as plasticizers.

Additives—Additives are chemicals or mixtures of chemicals that function to help with processing, curing, and/or with the physical properties of the media. As such, they include, but are not limited to the following: adhesion promoter(s), viscosifier(s), solvent(s), plasticizer(s), pigment(s), filler(s), release agent(s), dye(s), oxidizer(s), matrix forming catalyst(s), antioxidant(s), inhibitor(s), retarder(s), chain transfer agents, inert diffusing agent(s), microwave/infrared absorber(s), light stabilizer(s), and absorbant(s) (i.e O2,, H2O, proton, etc. . . . ).

Light—Light is electromagnetic radiation. Preferred ranges for the present invention are from microwaves to ultraviolet wavelengths.

Particle radiation—refers to alpha, beta, and neutron types of radiation.

Reversible photoactive components—once a spatial light intensity pattern is recorded by irradiation of photoactive components, some photoactive components are capable of undergoing a reverse reaction whereby the spatial light intensity pattern is significantly reduced or fully erased. Further, some photoactive components would be able to record and erase spatial light intensity patterns multiple times. The erase step uses light of a different wavelength, electrical energy, heat energy, sound energy or a combination thereof. Example components that are capable of reversibility are photochromics, photocycloadditions, and photorefractives. An alternative term to describe these reversible photoactive components is "rewritable".

Photodimerizable—Refers to (2+2), (4+2), and higher analogs of photocyclodimerization reactions. The reactions may be between to of the same type of molecule (homodimerization) or between two dissimilar molecules (heterodimerization). For instance, 9-cyanoanthracene is able to photodimerize with a second 9-cyanoanthracene molecule or a butadiene molecule.

The present invention makes use of mesophasic morphologies to produce light sensitive optical articles, for example DOEs, HOEs, GRINs, light guides, optical circuits, holographic data storage media and display holograms, that can have higher sensitivity, higher dynamic range, and/or reduced/eliminated polymerization induced shifting of recorded gratings (from shrinkage during photopolymerization) when compared to current technologies.

In general, mesophasic materials can have many forms. Thus, it is contemplated that photosentive articles derived from mesophasic media will encompass a large range of possibilities. For instance, one contemplated possibility is for the media to include three phases, one of which is discontinuous, and two that are bicontinuous cubic phases. Other possibilities, include a media having two phases representing lamellar phases. Still other possibilities include media comprising three continuous phases, all cubic. Hexagonal and other phases are also contemplated for specialty applications.

In addition to phase type, the chemical make up of the different phases is broken into three general categories, organic, inorganic, and organic-inorganic hybrids. A phase that is organic is understood to mean a phase of carbon based molecules as understood by organic chemist. Whereas, an inorganic phase is a phase of non-carbon molecules such as silicon, metal oxides, phosphorus, to name a few. An organic-inorganic hybrid phase is a phase that includes both organic and inorganic chemicals, sometimes as separate molecules and sometimes as single molecules with both organic and inorganic parts to the molecule.

Mesophasic materials allow for two independent phases within the same material. The two independent phases allow for the separation of chemical processes and reactions within the same material. For instance, reactions that would normally not be compatible with one another in a single phase can be realized when they occur in two separate phases. For example, a photocationic initiator could be used to polymerize vinyl ether in one phase and yet leave an acrylate located in a second phase unreacted. Normally, the use of a photocationic initiator would cause the free radical polymerization of an acrylate when located in the same phase.

Having two separate phases also allows one to have advanced material properties. For instance, in holographic data storage, mesophasic materials can be used to produce a material that is structurally rigid, yet allows for very fast diffusion of photosensitive materials. This can be accomplished if one phase is rigid and the other phase is softer. The rigid phase can be organic, for example a polymer with a Tg well above room temperature, or inorganic, for example, a sol-gel type material. The soft phase is preferably an uncrosslinked polymer with a low Tg or a lightly crosslinked polymer with ample solvent or plasticizer. The soft phase may even be almost liquid like with use of the right materials.

Preferably, the optical articles include organic components that form an interpenetrating cubic phase (IPCP), also referred to as bicontinuous cubic phase. If the IPCP dimensions are sufficiently small in comparison to the wavelength of light used to record a pattern or to read a pattern, light scattering caused when the light changes phases is minimized. Preferably, the IPCP has dimensions that are less than the wavelength of light used to record or read the patterns to the hologram, more preferably less than half of a wavelength, and most preferably less than a quarter of a wavelength.

Preferably, the IPCP is capable of being crosslinked to lock the phase morphology. Furthermore, preferably the IPCP is made in situ, meaning that the IPCP is made in the presence of a photosensitive material that is incorporated directly into the channels, pockets, and pores of the resultant material. Preferably the photosensitive material that reacts during recording of the hologram is either covalently attached to or adhered to the matrix support either during or after recording of the gratings to prevent loss of signal with time.

Mesophasic materials include two or more different phases. An advantage in using IPCP materials is that photopolymerizations can be performed in two or more independent phases depending on the composition of the phases. For instance, it may be desirable to perform one photopolymerization in one phase and then a separate photopolymerization in another phase at two different times and/or wavelengths.

Such separation allows multitudes of possibilities for applications. Following are some examples of how separate photopolymerizations in different phases can be used:
1) A first photopolymerization could be performed in one phase to stabilize the structure of the optical article and then later a separate photopolymerization could be used to record a grating in another phase.
2) A grating can be recorded in two phases at the same time using either monomers/photoinitiators soluble in both phases or two different monomers/initiators. In this embodiment, if two different initiators are used preferably they are sensitive to the same recording wavelength of light.
3) A grating can be recorded with one wavelength in one phase and then another grating can be recorded in a second in another phase using a second wavelength. In this embodiment, two initiators that are sensitive to two different wavelengths of light are used.
4) One or more data containing gratings can be recorded in one phase. A separate display hologram can then be recorded in a second phase.
5) A grating can be recorded using free radical chain photopolymerization in one phase. A second grating can then be formed with ionic chain polymerization in the same phase. Two separate gratings can then be recorded in another phase using radical chain polymerization and ionic chain polymerization. In a two-phase system, this allows the potential of recording at four different wavelengths assuming a proper choice of initiators and monomers.
6) A servo-tracking pattern can be recorded in one phase at one wavelength and another phase could be used to record multiplexed data at a second wavelength.

The above examples that mention recording a single grating are for illustration only. Multiplexing of gratings in the same phase can and commonly will occur. It is also understood that the combination given above can be combined in different manners and that the scope of different possibilities is far more than what can be described herein.

To prevent shrinkage of the mesophasic optical device during recording, preferably at least one of the phases is formulated to be a rigid matrix. A rigid phase is comprised of any polymeric material having a Tg greater than 50° C. More preferably, the rigid phase is comprised of polymeric material having a Tg greater than 100° C. Most preferably, the rigid phase is comprised of polymeric material having a Tg greater than 150° C. Preferably, the rigid matrix phase is organic. However, inorganic and organic-inorganic hybrid rigid phases are also contemplated. The rigid mesophasic phase functions in a similar capacity to the preformed rigid matrix supports from, for example, aerogel, xerogel or from Vycor. The rigid mesophasic phase prevents shrinkage of the optical device such that photoreaction of the photosensitive material does not result in grating angle shifting. The increased mechanical stability afforded by a rigid phase also leads to better archival life of recorded patterns when crosslinking and other mechanisms are incorporated.

In a mesophasic optical device having a rigid phase, preferably, the optical device also comprises a soft phase that is less hard than the rigid phase. The photopolymer may be contained in the rigid phase or the soft phase. However, the rigid phase may be unsuitable for grating formation using photopolymers due to low diffusion rates. Thus, for reasonable diffusion rates in the soft phase; the soft phase should have a Tg below 50° C.; more preferably, below 20° C.; and most preferably, below 0° C. It is also contemplated that the soft phase may sometimes comprise a viscous or non-viscous liquid (at room temperature), thereby possibly containing little or no polymeric material. The soft phase may be an organic, inorganic, or organic-inorganic hybrid phase. Though the rigid phase may be unsuitable for formation of photopolymer gratings, recording gratings using intramolecular changes of photochromic molecules can still be accomplished in the hard phase and is contemplated.

The soft phase preferably allows for fast diffusion rates. Accordingly, preferably, photoactive components and photopolymers are located in the soft phase. By having both a hard and a soft phase, an optical article can have both the structural strength of the hard phase and the fast diffusion rates of the soft phase. Preferably, all phases, regardless of rigidity or softness, should have similar refractive indices (plus or minus 0.2 from each other). More preferably, the different phases should be within 0.1 refractive index of one another. Most preferably, all phases have the same refractive index. The above refractive indices are of the individual phases without photoactive component(s).

Preferably, the optical article includes one or more photosensitive components capable of recording spatial light intensity differences at a single or multiple wavelengths. The photosensitive components are components that react during hologram formation to form the desired pattern. The photosensitive components can be monomers, oligomers, polymers, photochromics, photoinitiators, sensitizers, activators, and other light active compounds in combinations or separately as long as they produce the desired recording of spatial light intensity.

In one embodiment, the photosensitive components include both a monomer and a photoinitiator. Preferred photosensitive components include ethylene derivatives, for example, acrylates, vinyl ethers, styrenes, maleimides, and acrylamides. Preferred photoinitiators include photocleavage initiators, hydrogen abstraction initiators and dye-activator systems. When the optical article is exposed to light of the appropriate wavelength, the photoinitiator causes the monomers to react to form/record the desired spatial light intensity pattern. Preferably, the photosensitive components are sensitive to light at two or more wavelengths.

In another embodiment, the photosensitive components include photochromic or photorefractive materials. Preferred photochromic and photorefractive materials include stilbenes, cyanine dyes, spiro compounds diarylethenes, azobenzenes, fulgides, and dichromated gelatin. The photosensitive components may also include mixtures of monomers and photochromic molecules.

In some embodiments, it is contemplated to have one of the phases substantially devoid of photosensitive components. In such embodiments, less than 30% of the photosensitive component is located in the photosensitive devoid phase; more preferably, less than 10%; and most preferably, less than 1%. Having one phase devoid of the photosensitive component can kinetically increase sensitivity by increasing the effective concentration of the photosensitive components.

Preferably the optical article includes a di, tri, or greater block copolymer or surfactant system that forms interpenetrating networks. Preferred di-block copolymers include ethylene/propylene oxide, ethylene/ethylene oxide, and styrene/isoprene. Preferably, the block copolymer is organic. Preferred tri-block copolymers include tri-block copolymers of ethylene oxide and ethylene, for example, ethylene oxide-ethylene-ethylene oxide and the reverse. Preferably, the block copolymer contains functional groups capable of crosslinking. Preferably, the interpenetrating networks are cubic phases. Preferably, the interpenetrating networks do not scatter light at the recording wavelengths.

Preferably, the interpenetrating network is crosslinked after formation to lock in the phase morphology. The interpenetrating network may be crosslinked after formation by photopolymerization or photocyclization of groups attached to the interpenetrating network. Alternatively, the interpenetrating network may be crosslinked after formation by step growth type reactions of groups attached to the interpenetrating network. For example, isocyanate or epoxide reactions with alcohols or amines or thiols, cyclic anhydride reactions with alcohols or amines or thiol additions to enes. Chain reactions such as cationic epoxide cures, free radical cures, and anionic cures are also contimplated for locking in phase morphology. The stability of the interpenetrating network may also be increased by the formation of polymer in one of the phases. For example, polymerization of acrylamide in an ethylene oxide-ethylene block copolymer cubic phase material. The interpenetrating network may also be stabilized by a sol-gel reaction in situ. This would be an example of a templated sol-gel reaction.

In a preferred embodiment, the interpenetrating network includes a di-block or tri-block copolymer, photosensitive components and optionally a high or low boiling solvent. Preferred solvents include water, methanol, propylene carbonate, formamide, benzene or a plasticizer. In some embodiments using volatile components, the article may be sealed to prevent loss of the volatile components.

The optical article may be produced by combining materials that can form at least two phases, including an interpenetrating network, between two solid substrates in any convenient thickness. Alternatively, the materials may be coated on the surface of a substrate. Preferably, a phase of the material is then locked via a photo or thermally induced reaction. Preferably, the optical article does not need any post processing to extract or evaporate solvents.

In one preferred embodiment, the optical article includes a phase that contains a photosensitive material and a second phase that contains a photoactivated fixer in order to produce a photographic image. For example, the photosensitive material may be silver nitrate in one phase. The fixing agent located in a second phase may be released by a photocleavage reaction from the second phase into the first phase to develop the exposed regions.

In one embodiment, a nanosized filler material such as nanoparticles of silica or other substance is used as the rigid phase. For example, dispersing nanosized silica with an isocyanate/alcohol resin will result in a mesophasic material. In this case, one continuous organic phase and one discontinuous inorganic phase is formed. It is also understood that either the continuous phase or the discontinuous phase can be organic, inorganic, or organic-inorganic hybrids. Organic and organic-inorganic nanoparticles can be used. Such a system may provide enhanced kinetics for photopolymerization.

In another embodiment, the nanosized filler material represents a soft phase. In such an embodiment, at least one other phase is also soft. Either the continuous or the discontinuous phase (or both) has photosensitive components. It is possible that in such an embodiment that the solubility of an inert diffusing component or of one of the photosensitive components changes upon the irradiation of light, thus causing the inert diffusing agent or the photosensitive component to preferentially partition into one of the phases (continuous or discontinuous). Alternatively, upon irradiation of light, the inert diffusing agent or the photosensitive component would become equally soluble in either phase (continuous or discontinuous).

It is also recognized that introduction of nanoparticles that are themselves light active, such as nanospheres/nanoencapsulated micelles containing light reactive chromophores dispersed into an organic or inorganic matrix (that is also light active) is also with in the scope of this invention.

In another embodiment, the optical article is rewriteable. Molecules capable of photodimerization and the reverse reaction are placed in a mesophasic matrix. Preferred molecules include coumarins, thymines, maleimides, acenaphthylenes, and anthracenes. Preferably, the matrix is made to have pore or pocket sizes that allow for the passage of single molecules but are too small for the passage of a dimmer. If the material has this pore size, a rewriteable optical article in which mass transport and diffusion occurs can be produced. In such a system, areas being illuminated will cause dimerization. The dimers are essentially trapped in the area of illumination due to their size being too large to fit through the smallest pores. Whereby, molecules in the dark regions are still able to diffuse and even diffuse into the areas that were illuminated. Thus, the illuminated regions have a larger number of chromophores and a higher refractive index than the dark regions.

In an alternative embodiment of a rewriteable optical article, use is made of a matrix attachment methodology. In a matrix attachment methodology, one molecule is attached to the matrix and the other is freely diffusing through the channels of the nanoporous material. When a region is illuminated with the appropriate wavelength, dimerization between the freely diffusing component and the matrix attachment component occurs. As stated above, the dimer is locked into place and the dark regions still have freely diffusing molecules, which then diffuse evenly after illumination has ended. This sets up an index of refraction gradient, which can be used in holographic data storage.

In yet another embodiment, use is made of a change in solubility of a photoactive molecule to make a rewriteable material. In this embodiment, photoactive molecules, for example, azobenzenes, fulgides, spiropyrans, spironaphthoxazines, diarylethenes, formazan, and others, are placed into a mesophasic material whereby there is a continuous phase and a discontinuous phase. In a preferred embodiment spiropyran or spironaphthoxazine is placed in a matrix that has a discontinuous non-polar phase and a polar continuous phase. Either a spiropyran or spironapthoxazine with a kinetic and thermodynamic equilibrium shifted toward the closed (non-polar) spiro form may remain in the discontinuous non-polar phase until irradiated with light of blue wavelengths. When illuminated with blue light, the open (polar) mericyanine form is generated which may diffuse into and throughout the continuous polar phase, yet because the molecules prefer the closed form, a dark and red light assisted ring closing reaction occurs in real time. The ring closing reaction will cause the spiro form to be deposited in the nearest unilluminated discontinuous non-polar phase. Thus, upon irradiation of a sample with the appropriate Spiro molecules and mesophasic matrix, the Spiro molecules may be systematically "deposited" in the dark regions of an interference pattern, thus forming a grating. The optical article may be erased by simply irradiating the optical article with a uniform blue diode. This system in its current rendition, does have the issue of volatile readout, however, there are other molecules and ways of modifying the spiropyrans such that they would be gated or primed and then fixed until an erase cycle. It is also realized that such a system could be designed wherein the molecule are "deposited" in the illuminated regions. It is also realized that the matrix polarity can be changed, thus causing molecules to diffuse to or away from lit regions.

Other embodiments of the present inventions include the formation of a monolithic block of material. In this embodiment, the mesophasic material is mechanically rigid enough to support itself with out sagging, cracking, or otherwise changing mechanical properties. In this form, the media preferably does not use a substrates. Also, any antireflective coatings, labels, edge seals, or other items typically used for a final photosensitive article may be applied directly to the monolithic block. In addition to monolithic blocks, it is also contemplated that fibers, films, and other forms can be made.

The invention may be better understood with reference to the following examples.

EXAMPLE 1

1.273 grams Brij 58 (surfactant from ICI Americas, Inc.)
0.691 grams distilled water
0.359 grams Acrylamide
55 mg Allyl Thiourea
8.3 mg Thionin Perchlorate A sample was made by mixing together the above listed components and then heating the mixture to 100° C. to form a homogenous liquid. The homogenous liquid was placed between two glass slides with spacers of 0.100 mm thickness and allowed to cool to room temperature. Several holograms were then written to the material. The material had an diffraction efficiency M/# of approximately 1.7 and a 90% retention of holograms after 1 hour at which time the signal stabilized and did not decrease further for 1 week. A single hologram of 60% diffraction efficiency was possible.

The surfactant forms a bicontinuous cubic phase or gyroid phase when water is added in amounts greater than 20 wt %. The initiator dye (thionin perchlorate), the coinitiator (allyl thiourea), and the acrylamide monomer are soluble in the water rich phase. Though the matrix is not crosslinked or even a thermoplastic, the matrix is at a thermodynamic equilibrium and thus will be stable for an indefinite time as long as water is not allowed to evaporate from the system. Upon irradiation, the monomer is polymerized. The polymer then further stabilizes the mesophase, making it less likely to change. Thus the holograms formed in this manner are stable for months at room temperature but disappear upon heating.

EXAMPLE 2

Example 1 is repeated except that both thionin perchlorate and I784 are used as initiator dyes. The material produced is panchromatic and can be initiated at a wide variety of wavelengths.

This system is useful for making display holograms where multiwavelength sensitivity allows for the creation of full color display holograms. Additionally, it has additionally been found that thionin perchlorate with activators in a matrix with a pH greater than 6 is panchromic without the need for adding I784 or other initiators.

EXAMPLE 3

An Ormosil type of media is made using a surfactant and $Si(OR)_4$. The media has a sol-gel matrix. Previously, when media using such materials were used for optical storage the material was made and then post processed. In other words, the monomers, initiator, and solvent were diffused into the porous glass network after a baking/sintering step. In this embodiment, the sol-gel mixture is made containing the monomers and initiators and no post processing is performed. Thus, the sol-gel components are mixed and allowed to react, but no surfactant or solvent extraction is performed. The matrix can vary from being rigid to flexible depending on the silicate precursors used.

EXAMPLE 4

A matrix is made using a crosslinked organic matrix of vinyl ether or isocyanate. This is a desired form of a mesophasic materials since heat will not change the mesophase as is possible with the system described in example 1. Additionally, it will be desirable (though not necessary) to make one of the phases an organic glass. This then will mimic the sol-gel systems and have the added advantage of zero shrinkage during polymerization.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

This application discloses numerical range limitations. Persons skilled in the art will recognize that the numeral ranges disclosed inherently support any range within the disclosed numeral ranges even thought a precise range limitation is not stated verbatim in the specification because this invention can be practiced throughout the disclosed numerical ranges and at other numerical ranges which persons skilled in the art will find this invention operable.

What is claimed is:

1. A photosensitive article comprising:
   a mesophasic material; and
   photosensitive components, wherein the mesophasic material is formed in the presence of the photosensitive components, the article is a data storage device, display holography device, HOE, DOE, GRIN, optical circuit, or waveguide.

2. The photosensitive article of claim 1, further comprising one or more additives.

3. The photosensistive article of claim 1, wherein the mesophasic material comprises a bicontinuous cubic phase.

4. The photosensistive article of claim 3, wherein one of the continuous phases comprises a rigid polymeric material with a Tg greater than 50° C.

5. The photosensistive article of claim 4, wherein the rigid polymeric material is organic.

6. The photosensistive article of claim 4, wherein the rigid polymeric material is inorganic or an inorganic-organic hybrid.

7. The photosensistive article of claim 3, wherein one of the continuous phases comprises a soft polymeric material with a Tg less than 30° C.

8. The photosensistive article of claim 3, wherein one of the continuous phases is substantially devoid of the photosensitive components.

9. The photosensistive article of claim 8, wherein the photosensitive components are selected from the group consisting of a photoinitiator, a monomer, a photochromic, a photorefractive component, and a photodimerizable component.

10. The photosensistive article of claim 7, wherein the soft polymeric material is organic.

11. The photosensistive article of claim 7, wherein the said soft polymeric material is inorganic or organic-inorganic hybrid.

12. The photosensistive article of claim 4, wherein the rigid polymeric material is crosslinked.

13. The photosensistive article of claim 3, wherein one of the continuous phases does not comprise polymeric material.

14. The photosensistive article of claim 3, wherein at least one of the continuous phases comprises matrix attached polymerizable groups capable of copolymerizing with monomer.

15. The photosensistive article of claim 8, wherein the photosensitive components comprise one or more components that are sensitive to at least two different wavelengths.

16. The photosensistive article of claim 1, wherein the mesophasic material is comprised of at least one continuous phase and at least one discontinuous phase.

17. The photosensistive article of claim 16, wherein one of the continuous phases is further comprised of photosensitive components.

18. The photosensistive article of claim 17, wherein the photosensitive components are selected from the group consisting of a photoinitiator, a monomer, a photochromic, a photorefractive component, and a photodimerizable component.

19. The photosensistive article of claim 1, wherein at least one of the photosensitive components is reversible.

20. The photosensistive article of claim 16, wherein the discontinuous phase is comprised of nanoparticles.

21. The photosensistive article of claim 20, wherein the nanoparticle are inorganic, organic, or an organic-inorganic hybrid.

22. The photosensistive article of claim 21, wherein the nanoparticles comprise silica.

23. A method of making a data storage device, display holography device, HOE, DOE, GRIN, optical circuit, or waveguide comprising:
    mixing photosensitive components with at least another component; and
    forming a mesophasic material having at least two phases.

24. The method of claim 23, wherein the mesophasic material comprises only organic polymers.

25. The method of claim 23, wherein the mesophasic material comprises only inorganic polymers.

26. The method of claim 23, wherein the mesophasic material comprises organic polymers, inorganic polymers or organic-inorganic hybrid polymers.

27. The method of claim 23, wherein the mesophasic material is deposited between two substrates to form the photosensitive article.

28. The method of claim 23, wherein the mesophasic material is deposited onto a substrate to form the photosensitive article.

29. The method of claim 23, wherein the mesophasic material forms a solid monolithic block.

30. The method of claim 23, wherein the article further comprises an edge seal, an antireflective coating, a servo pattern, a labeling or a cartridge.

31. The method of claim 23, wherein at least one of the phases forms a crosslinked polymer that locks the mesophase morphology.

32. The method of claim 31, wherein the crosslinked polymer is formed by application of light, heat, particle radiation, electric current or sonication.

33. The method of claim 32, wherein the light is of a different wavelength than that used to record spatial light intensity patterns.

34. The method of claim 31, wherein the crosslinking is formed by a step polymerization mechanism.

35. The method of claim 31, wherein the crosslinking occurs during recording of spatial light intensity patterns.

36. A method of making a data storage device, display holography device, HOE, DOE, GRIN, optical circuit, or waveguide comprising:
    mixing photosensitive components with at least one other component to form a mesophasic photosensitive media without any extractions, infusions, and/or evaporations of components.

37. The method of claim 36, wherein the mesophasic photosensitive media comprises nanoparticles as one of the phases.

38. A method of making a photosensitive article comprising:
mixing photosensitive components with at least one other component to form a mesophasic article without mechanical processing, chemical processing, or photochemical processing, to form the mesophasic article.

39. A rewriteable photosensitive article comprising:
a mesophasic material comprising photosensitive components, wherein the photosensitive article is rewriteable.

* * * * *